United States Patent
Stewart et al.

(10) Patent No.: US 7,035,300 B2
(45) Date of Patent: Apr. 25, 2006

(54) CALIBRATION OF A MULTI-CHANNEL OPTOELECTRONIC MODULE WITH INTEGRATED TEMPERATURE CONTROL

(75) Inventors: James Stewart, San Jose, CA (US); Lucy G. Hosking, Santa Cruz, CA (US); Anthony Ho, Richmond, CA (US); Andreas Weber, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 321 days.

(21) Appl. No.: 10/700,845

(22) Filed: Nov. 4, 2003

(65) Prior Publication Data

US 2004/0114646 A1 Jun. 17, 2004

Related U.S. Application Data

(60) Provisional application No. 60/423,969, filed on Nov. 5, 2002.

(51) Int. Cl.
*H01S 3/04* (2006.01)

(52) U.S. Cl. .......................................... 372/34; 372/36

(58) Field of Classification Search ................. 372/34, 372/36, 20, 43; 356/491
See application file for complete search history.

(56) References Cited

U.S. PATENT DOCUMENTS

| | | | |
|---|---|---|---|
| 4,359,553 A | 11/1982 | Edwards | |
| 4,378,451 A | 3/1983 | Edwards | |
| 4,631,728 A | 12/1986 | Simons et al. | |
| 5,019,769 A | 5/1991 | Levinson et al. | |
| 5,024,535 A | 6/1991 | Winston, Jr. | |
| 5,041,491 A | 8/1991 | Turke et al. | |
| 5,281,516 A | 1/1994 | Stapleton et al. | |
| 5,345,455 A * | 9/1994 | Gabriagues et al. | ........... 372/20 |
| 5,516,563 A | 5/1996 | Schumann et al. | |
| 5,604,758 A | 2/1997 | AuYeung et al. | |
| 6,055,252 A | 4/2000 | Zhang | |
| 6,272,157 B1 * | 8/2001 | Broutin et al. | ................. 372/32 |
| 6,321,003 B1 * | 11/2001 | Kner et al. | ................... 385/24 |
| 6,323,987 B1 * | 11/2001 | Rinaudo et al. | ............. 359/260 |
| 6,327,287 B1 * | 12/2001 | Kner et al. | ............... 372/43.01 |
| 6,353,623 B1 * | 3/2002 | Munks et al. | ................. 372/20 |
| 6,400,737 B1 | 6/2002 | Broutin et al. | |
| 6,898,221 B1 * | 5/2005 | Berger et al. | ................. 372/32 |
| 2002/0163942 A1 * | 11/2002 | Baillargeon et al. | .......... 372/20 |
| 2002/0164125 A1 * | 11/2002 | Berger et al. | ................. 385/39 |
| 2003/0152390 A1 | 8/2003 | Stewart et al. | |
| 2004/0036888 A1 * | 2/2004 | Gupta et al. | ................. 356/491 |
| 2004/0114646 A1 | 6/2004 | Stewart et al. | |
| 2005/0013332 A1 * | 1/2005 | Kish et al. | ..................... 372/32 |
| 2005/0018720 A1 * | 1/2005 | Kish et al. | ..................... 372/20 |

OTHER PUBLICATIONS

"4-Channel Temperature Tunable 40 mW CW DFB Laser with Locker CQF474/708 Series." JDS Uniphase Product Bulletin. www.jdsu.com. 3pp, no months.

(Continued)

*Primary Examiner*—Shih-Chao Chen
*Assistant Examiner*—Hung Tran Vy
(74) *Attorney, Agent, or Firm*—Workman Nydegger

(57) ABSTRACT

A method for calibrating a multi-channel laser emitter in an optoelectronic transceiver or an optoelectronic transmitter for a first wavelength includes monitoring the wavelength of optical signals from the laser emitter while varying its temperature as well as other operating conditions, and then storing calibration information in the memory of a microprocessor. The initial values of the calibrating procedure are reset and the calibrating procedure is repeated to obtain calibration information for a next desired wavelength.

6 Claims, 8 Drawing Sheets

OTHER PUBLICATIONS

"SFF-8053 Specification for GBIC (Gigabit Interface Converter)." SFF Committee. Sep. 27, 2000. www.schelto.com/t11_2/GBIC/sff-8053.pdf. 82 pp, no months, year.

"Small Form-factor Pluggable (SFP) Transceiver MulitSource Agreement (MSA)." www.schelto.com/SFP/SFP%20MSA.pdf. Sep. 14, 2000 38 pp.

* cited by examiner

Channel Lookup
Table
1000

| channel | temperature | $I_{laser\ bias}$ | AC modulation |
|---------|-------------|-------------------|---------------|
| 1 | 43 C | 0.5 A | 1.5 |
| 2 | 34 C | 0.55 A | 1.1 |
| ⋮ | ⋮ | ⋮ | ⋮ |

CALIBRATION OF A MULTI-CHANNEL OPTOELECTRONIC MODULE WITH INTEGRATED TEMPERATURE CONTROL

This application claims priority to, and hereby incorporates by reference, U.S. Provisional patent application 60/423,969, filed Nov. 5, 2002.

BRIEF DESCRIPTION OF THE INVENTION

The present invention related generally to optoelectronic components. More particularly, the present invention relates to method for calibrating a multi-channel, fiber-optic laser transmitter.

BACKGROUND

The proliferation of communication technologies creates increases in demand for data transfer channels. Optical networks are a highly-reliable and efficient way to satisfy this demand. As a result, there is a desire to achieve higher data throughput in existing optical networks. A current means for satisfying this desire is the use of Dense Wave Division Multiplexing (DWDM). As shown in FIG. 1, DWDM data from a plurality of sources is converted into optical signals 2 with different wavelengths by a plurality of optoelectronic transceivers 4. After being multiplexed by an optical multiplexer/demultiplexer 6, optical signals 2 may pass through a single optical cable 8 simultaneously, which greatly increases network throughput.

There are several standards for a signal traveling through an optical network. These standards specify acceptable wavelengths of a signal (channel) and the distance or spacing between neighboring channels. There exists a need, therefore, for optoelectronic transceivers capable of operating on specific wavelengths. Currently, the most popular standards are 200 GHz (gigahertz) spacing, which is equivalent to 1.6 nm (nanometers) spacing between neighboring channels, 100 GHz, equivalent to 0.8 nm spacing, 50 GHz, equivalent to 0.4 nm spacing, and 25 GHz equivalent to 0.2 nm spacing between channels. The specific wavelengths (i.e., channels) acceptable for data transfer in an optical network are proscribed by the International Telecommunications Union (ITU).

Optical amplifiers, used to increase the strength of an optical signal before it enters an optical network, typically have an optimal operational wavelength range. For modern Ebrium-Doped Fiber Amplifiers (EDFA) the typical operational wavelength range is 1523 to 1565 nm. If the network is using a 200 GHz standard for channel spacing, the number of available channels is 22. For a 100 GHz standard, the number of channels is 45; for a 50 GHz standard there are 90 channels; for a 25 GHz standard there are 180 channels.

FIG. 2 shows a schematic representation of wavelength intervals when the channel spacing standard is 100 GHz. The distance between neighboring channel centers 10 is 0.8 nm. For a signal to stay within the allowed pass band 14 its wavelength must be within 0.1 nm of the center of the specified channel. Operation outside the allowable allowed pass band 14 results in high attenuation of the transmitted signal, and in extreme cases, potential cross-talk with an adjacent channel.

The wavelength emitted by the laser shifts as the laser emitter ages. In order to calculate how much the laser emitter wavelength can shift before it starts encroaching on a neighboring channel, several parameters of laser emitter calibration must be taken into account.

When calculating the allowable pass band of a laser emitter, an allowance must be made for an initial setup tolerance 16 (FIG. 3) and temperature control tolerance 18. For example, for a part in which the initial wavelength is targeted at the center channel, and with a set-up tolerance of +/−10 pm (picometers), and a temperature control tolerance of +−20 pm, for a combined set-up and temperature control tolerance of +/−30 pm. Based on these tolerances and a 100 pm maximum total wavelength offset tolerance, the allowable wavelength aging is +/−70 pm over the life of the part.

There are several factors determining the wavelength of a signal produced by traditional laser sources. These factors include current density, temperature of the laser emitter, as well as specific inherent characteristics of the laser emitter. The relationship between the temperature of the laser emitter and the wavelength produced is typically around 0.1 nm/° C. for Distributed Feedback ("DFB") sources that are commonly used in DWDM applications. This means that if the laser emitter temperature is increased by 10° C., the wavelength of the emitted light will shift about +1 nm.

Since the wavelength produced by a transceiver at a specified laser emitter temperature and current density differs from one laser emitter to the other, the optoelectronic transceivers are initially calibrated before being installed in an optical network. The calibration includes monitoring the wavelength of optical signals produced by the laser emitter while varying its temperature as well as other operating conditions, and then storing calibration information in the memory of a microprocessor. It also includes receiving analog signals from sensors in the optoelectronic device and converting the analog signals into digital values, which are also stored in the memory. As a result the device generates control signals based on the digital values in the microprocessor to control the temperature of the laser emitter. The method of calibrating an optoelectronic transceiver is described in detail in a United State patent application entitled "Control Circuit for Optoelectronic Module With Integrated Temperature Control," identified by Ser. No. 10/101,248, and filed on Mar. 18, 2002, which is incorporated herein by reference.

For performance and reliability reasons, it is desirable to operate a laser emitter at a temperature between 15° C. and 50° C. In some embodiments the useful operating temperature range of the laser emitter is 20° C. to about 70° C. There are several factors limiting the acceptable range of operating temperatures. First, a laser emitter ages more rapidly when operated at temperatures above 50° C., and may cause reliability concerns at typical end of life conditions (20–25 years). The quantum efficiency of the laser emitter decreases with age and, therefore, forces the transceiver to operate at higher currents in order to provide a fixed optical power, which further accelerates the aging of the laser emitter. In addition, temperature performance characteristics of the device used to control the laser temperature determine the lower limit of the available range of temperatures. A well-designed thermal system using a single-stage thermoelectric cooler (TEC) as a temperature control device can typically provide up to 40° C. cooling. Since the standard maximum operating temperature of a transceiver is 70° C., the 40° C. cooling capability of the TEC means that the effective operating range of the laser emitter in the transceiver is restricted to temperatures between 30° C. and 50° C.

In previously known devices a single transceiver is only calibrated to produce a signal at one specific wavelength. If a service provider of an optical network wants to utilize all available channels, it must, therefore, keep an inventory of separate transceivers for each channel used in the network. It becomes problematic for an optical network provider to keep such a large inventory.

SUMMARY

One embodiment of a method of calibrating a multichannel optoelectronic assembly includes selecting as a target wavelength a wavelength from a set of wavelengths including two or more wavelengths, setting a temperature of the optoelectronic assembly to a first value, and then adjusting the temperature with increments greater than an adjustment amount until a difference between an output wavelength of the optoelectronic assembly and the target wavelength is less than a first predefined value. The method further includes setting one or more operating values of the optoelectronic assembly, the one or more operating values affecting the temperature, adjusting the temperature with increments less than the adjustment amount until the difference between the output wavelength of the optoelectronic assembly and the target wavelength is less than a second predefined value, the second predefined value less than the first predefined value, and storing the temperature and the one or more operating values once the difference between the output wavelength of the optoelectronic assembly and the target wavelength is less than the second predefined value. The selecting step, each of the setting steps, each of the adjusting steps, and the storing step are repeated for each additional wavelength in the set of wavelengths.

DESCRIPTION OF EMBODIMENTS

A number of embodiments of the invention are described below. In the interest of clarity, not all features of an actual implementation are described. It will be appreciated that in the development of any such embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
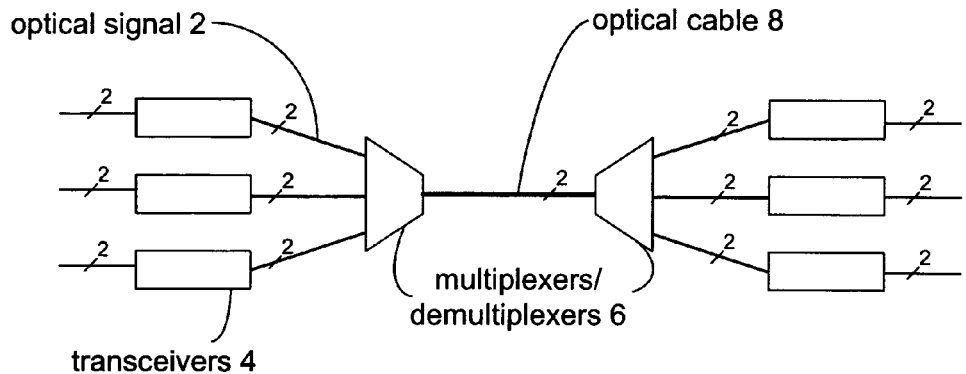
FIG. 1 is a schematic representation of a multi-channel optical network.
Figure 2:
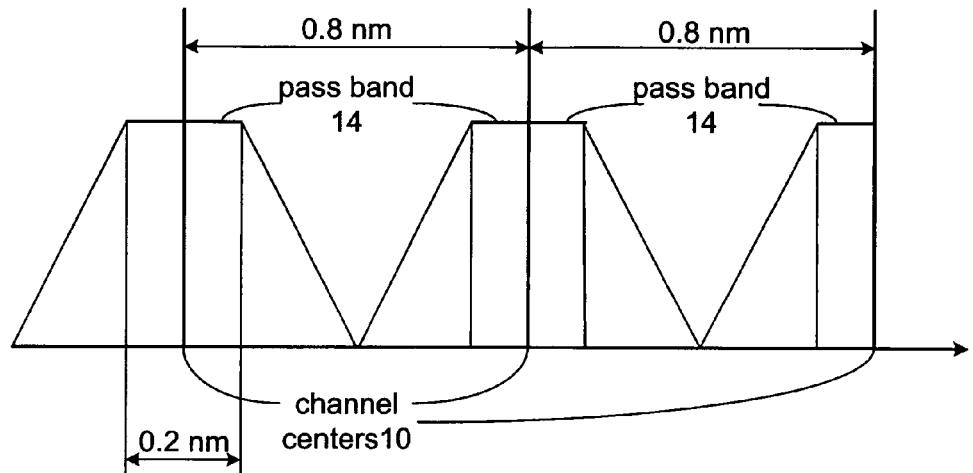
FIG. 2 is a schematic representation of a wavelengths in multi-channel 100 GHz standard.
Figure 3:
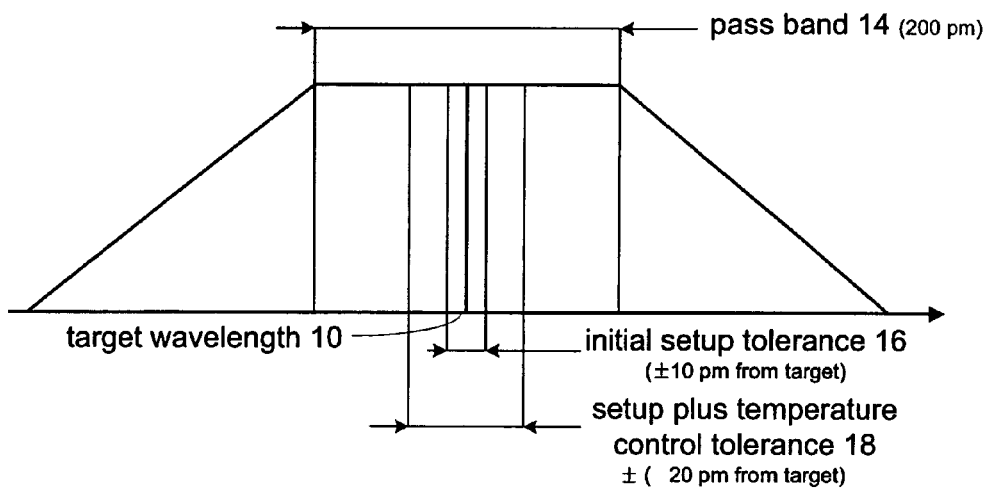
FIG. 3 is a schematic representation of a laser emitter, pass band calculation.
Figure 4:
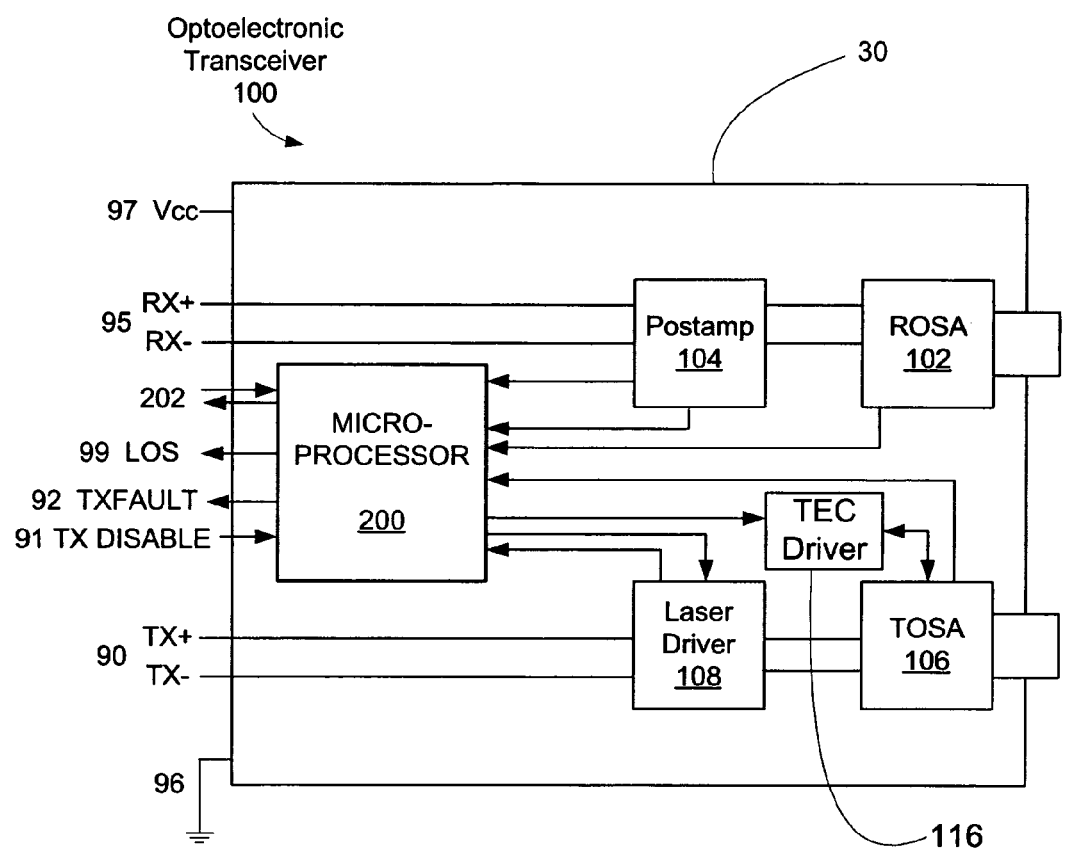
FIG. 4 is a block diagram of an embodiment of an optoelectronic transceiver.

FIG. 4 shows a schematic representation of a fiber optic transceiver 100. Transceiver 100 contains at a minimum transmit and receiver circuit paths and power 97 and ground connections 96. Further, transceiver 100 includes a Receiver Optical Subassembly (ROSA) 102, which contains a mechanical fiber receptacle and coupling optics, as well as a photo diode and a pre-amplifier (preamp) circuit. ROSA 102 is in turn connected to a post-amplifier (postamp) integrated circuit 104, the function of which is to take relatively small signals from ROSA 102 and amplify and limit them to create a uniform amplitude digital electronic output, which is connected to outside circuitry via the RX+ and RX− pins 95. The postamp circuit 104 provides a digital output signal known as Signal Detect or Loss of Signal indicating the presence or absence of suitably strong optical input. All the components of the transceiver 100 are preferably located in a protective housing 30, except for connectors that may protrude from the housing.

Suitable housings, including metallic, plastic, potting box and other housing structures are well known in the art. In one embodiment, the protective housing 30 are as follows: width, 3 cm or less; length, 6.5 cm or less, and height, 1.2 cm or less. A GBIC standard (SFF-8053 GBIC standard version 5.5) requires the dimensions of a module housing to be approximately 3 cm×6.5 cm×1.2 cm. Thus, the protective housing 30 of this embodiment meets the form factor requirements of the GBIC standard. In another embodiment, the physical dimensions of the module housing are: width, 0.54 inches or less; length, 2.24 inches or less; and height, 0.34 inches or less. The SFP MSA (Small Form Factor Pluggable Multisource Agreement) requires the dimensions of a compliant module housing to be approximately 0.54"×2.24"×0.34". Thus, the module housing in that embodiment meets the form factor requirements of the SFP standard. Note that the present invention is not limited to the form factor requirements described above. A person of ordinary skill in the art having the benefit of this disclosure will appreciate that the present invention is adaptable to various existing or yet to be determined form factors, some of which can be smaller than the ones identified here.

The transmit circuitry of transceiver 100 consists of a Transmitter Optical Subassembly (TOSA) 106 and a laser driver integrated circuit 108, with signal inputs obtained from the TX+ and TX− pins 90. TOSA 106 contains a mechanical fiber receptacle and coupling optics, as well as a thermo-electric cooler (TEC) and a laser diode or LED. The laser driver circuit 108 provides AC drive and DC bias current to the laser. The signal inputs for the driver are obtained from I/O pins (not shown) of transceiver 100. In other embodiments, the TEC is external to the TOSA 106. In yet other embodiments, the TEC is integrated within a laser transistor-outline (TO) package.

In addition, the optoelectronic transceiver 100 includes a thermo-electric cooler (TEC) driver 116 and additional circuitry that is not shown for controlling the temperature of the TOSA 106. An embodiment of the TEC driver 116 and the additional circuitry is described in greater detail below in connection with FIG. 5.

Also shown in FIG. 4 is microprocessor 200, which may comprise one, two or more chips, configured for controlling the operations of the transceiver 100. Suitable microprocessors include the PIC16F873A, PIC16F8730 and PIC16F871 8-bit CMOS FLASH microcontrollers manufactured by Microchip Technology, Inc. Microprocessor 200 is coupled to provide control signals to the post-amplifier 104 and laser driver 108, and these components and the ROSA 102 and TOSA 106 provide feedback signals back to the microprocessor 200. For example, microprocessor 200 provides signals (e.g., bias and amplitude control signals) to control the DC bias current level and AC modulation level of laser driver circuit 108 (which thereby controls the extinction ratio (ER) of the optical output signal), while post-amplifier circuit 104 provides a Signal Detect output to microprocessor 200 to indicate the presence or absence of a suitably strong optical input.

Importantly, the bias current level and the AC modulation level both affect the optical output wavelength of transceiver 100. Persons skilled in the art recognize that increases in the bias current and, to a lesser extent, increases in the AC modulation can increase the temperature of the active region of a laser chip. More specifically, as the bias current and AC modulation increase, so does the power dissipation of the laser chip. And as the power dissipated in the laser chip increases, so does the temperature of the laser chip, which has a fixed thermal resistance. This is true even though the temperature at the base of the laser chip is typically controlled by the TEC 116.

Temperature and/or other physical conditions of various components of transceiver 100 may be acquired using sensors that are coupled to microprocessor 200. In some embodiments, conditions of the optical links may also be acquired using the sensors.

In addition to, and sometimes in conjunction with these control functions, there are a number of other tasks that may be handled by microprocessor 200. These tasks include, but are not necessarily limited to, the following:

- Setup functions. These generally relate to the required adjustments made on a part-to-part basis in the factory to allow for variations in component characteristics such as laser diode threshold current.
- Identification. This refers to the storage of an identity code within a general purpose memory (e.g., an EEPROM). Additional information, such as sub-component revisions and factory test data, may also be stored within the general purpose memory for purposes of identification.
- Eye safety and general fault detection. These functions are used to identify abnormal and potentially unsafe operating parameters and to report these to the host device and/or perform laser shutdown, as appropriate. Sensors may be used to identify such abnormal or potentially unsafe operating parameters.
- Receiver input optical power measurement. This function is used to measure the input optical power and a report of this measurement may be stored in the memory.
- Laser diode drive current. This function is used to set the output optical power level of the laser diode.
- Laser diode temperature monitoring and control. In one embodiment, a temperature controller (e.g., a thermal-electric cooler (TEC)) is disposed in or near TOSA 106 for controlling the temperature of the laser emitter therein. In this embodiment, microprocessor 200 is responsible for providing control signals to the temperature controller.

Note that transceiver 100 has a serial interface 202 for communicating with a host device. As used herein, a host device refers to a link card to which a transceiver is attached and/or a host system computer to which a transceiver provides an optical connection. Host systems may be computer systems, network attached storage (NAS) devices, storage area network (SAN) devices, optoelectronic routers, as well as other types of host systems and devices.

In some embodiments the optoelectronic transceiver 100 includes an integrated circuit controller that may perform some of the functions listed above. For example, an integrated circuit controller performs the tasks of identification and eye safety and general fault detection, while the microprocessor provides control signals to the temperature controller and also may perform other tasks.

Further, the optoelectronic transceiver may also include the TX disable 91 and TX fault 92 pins described in the GBIC (Gigabit Interface Converter) standard. In the GBIC standard (SFF-8053), the TX disable pin 91 allows the transmitter to be shut off by the host device, while the TX fault pin 92 is an indicator to the host device of some fault condition existing in the laser or associated laser driver circuit.

Figure 5:
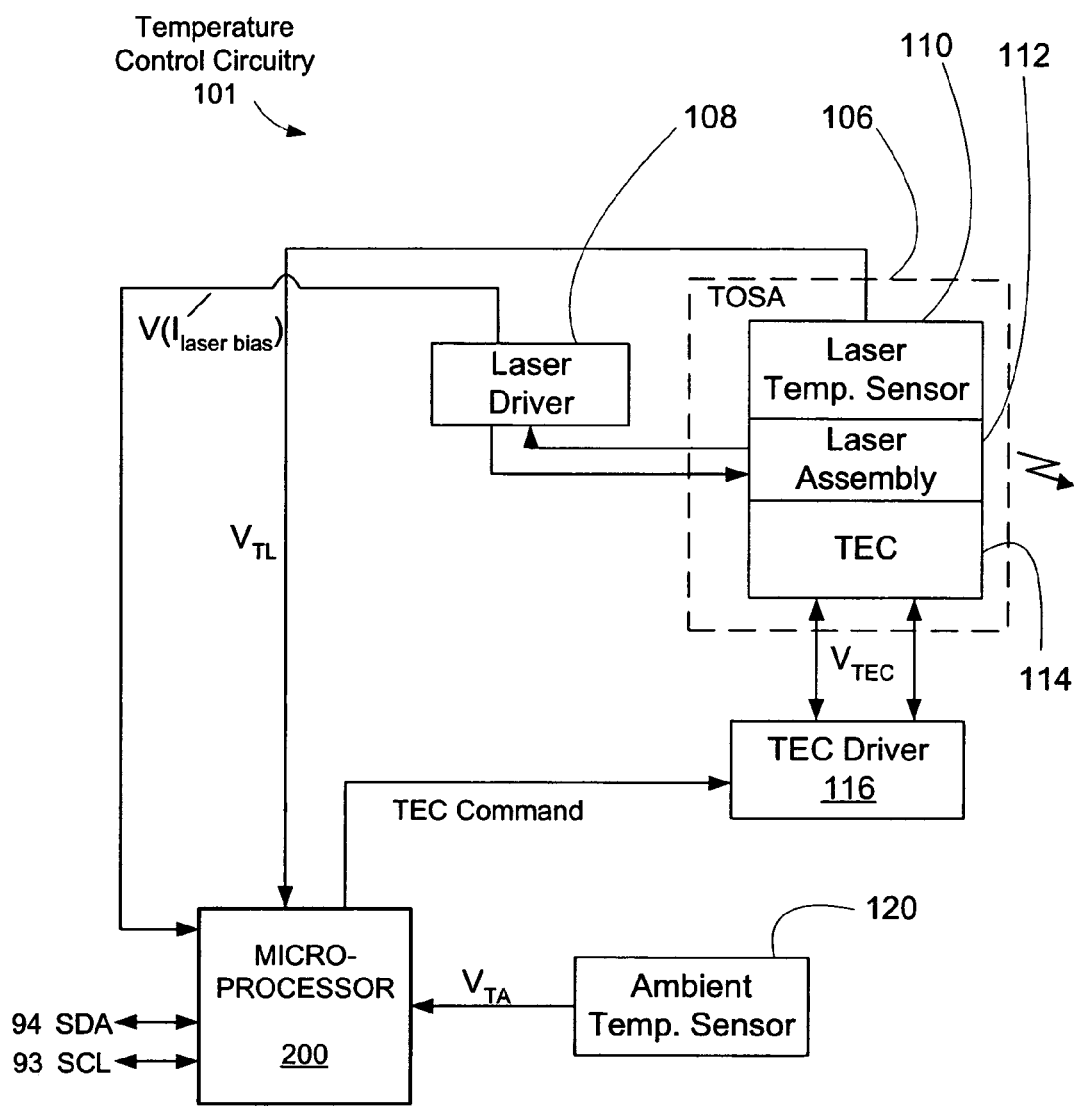
FIG. 5 is a block diagram illustrating circuitry for controlling the temperature of a laser emitter.

FIG. 5 illustrates a portion of temperature control circuitry 101 of the transceiver 100. The temperature control circuitry 101 is coupled to a TOSA 106. In some embodiments, TOSA 106 includes a laser assembly 112 (e.g., a laser transistor outline package), which in turn includes a laser emitter (e.g., an edge emitting laser diode) that is activated when a positive bias current, $I_{laser\ bias}$, is applied across its p-n junction. Also shown in FIG. 5 are a laser temperature sensor 110 and a thermoelectric cooler (TEC) 114 coupled to the laser assembly 112. In some other embodiments, the laser temperature sensor 110 and/or the TEC 114 are integrated within the laser assembly 112. In yet other embodiments, the laser temperature sensor 110 and/or the TEC 114 are external to the TOSA 106.

In some embodiments, the laser temperature sensor 110 is a thermistor. Any other device suitable for measuring the temperature of the laser diode may also be used. The laser temperature sensor 110 generates a signal ($V_{TL}$) that varies as a function of the temperature of the laser diode. As described above, and as is well known to those skilled in the art, the wavelength of optical signals generated by a laser diode varies as a function of the temperature of the laser diode. Accordingly, in other embodiments, a sensor that measures the wavelength of the optical signals directly may be substituted for the laser temperature sensor 110. In still other embodiments, a device measuring an operating condition of the laser diode that varies as a function of the temperature of the laser diode is used instead of the laser temperature sensor 110.

With reference still to FIG. 5, laser driver circuitry 108 supplies both AC drive power and a positive DC bias current $I_{laser\ bias}$ to the laser assembly 112 to activate the laser emitter and to set the AC modulation of the laser assembly. The microprocessor 200 controls this aspect of the laser driver circuitry 108 via the bias control signal and the amplitude control signal. The laser driver circuitry 108 also transmits a voltage $V(I_{laser\ bias})$, which is proportional to the $I_{laser\ bias}$, so that the microprocessor 200 may indirectly monitor the actual value of $I_{laser\ bias}$, which may vary due to operating conditions such as temperature. In some embodiments, the microprocessor 200 monitors a signal from a back facet photodiode (also called a monitor photodiode) instead of (or in addition to) the voltage $V(I_{laser\ bias})$. In some embodiments the microprocessor 200 uses the monitored signal(s) to determine an adjustment to the DC bias current $I_{laser\ bias}$.

An additional input is provided to the microprocessor 200 by an ambient temperature sensor 120, which measures the ambient temperature surrounding the TOSA 106 and generates a signal ($V_{TA}$) for the microprocessor 200 that varies as a function of the ambient temperature. Although a laser temperature sensor 110 is preferably placed in the proximity of a laser emitter, the temperature reading from the laser temperature sensor 110 generally differs from the actual temperature of the laser emitter because the laser temperature sensor 110 is physically separated from the laser emitter.

As a consequence, the temperature reading from the laser temperature sensor 110 and its signal $V_{TL}$ vary as a function of the outside temperature. By receiving the ambient temperature signal $V_{TA}$, the microprocessor 200 is able to compensate for the effect of the ambient temperature on the temperature reading from the laser temperature sensor.

Figure 6:
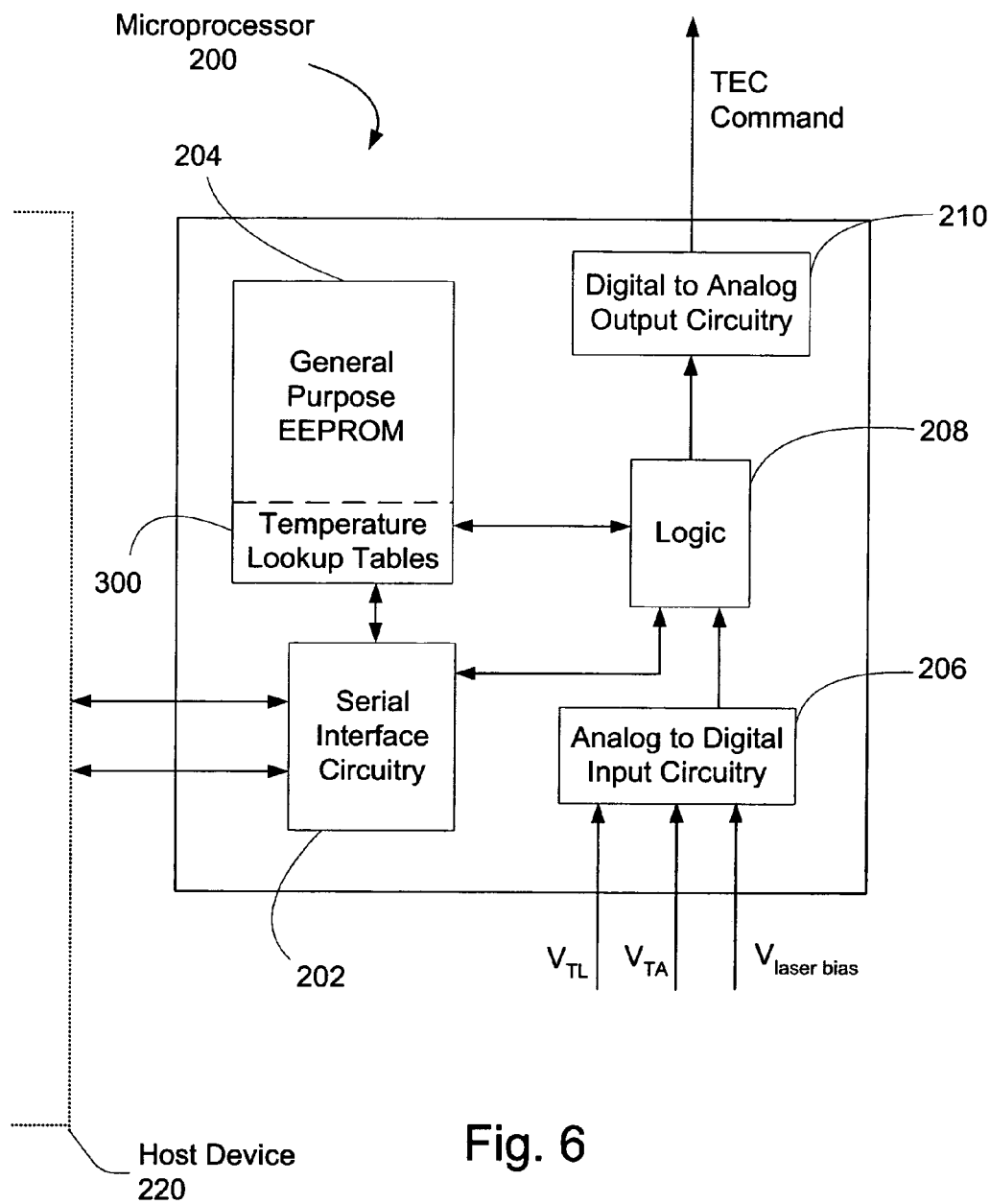
FIG. 6 is a block diagram depicting a portion of a circuit implementing the microprocessor of FIG. 5.

In addition to the $V(I_{laser\ bias})$, $V_{TL}$ and $V_{TA}$ signals, the microprocessor 200 receives inputs from a host device 220 through serial interface circuitry 202 (FIG. 6). In some embodiments, using the information collected from the host device, the laser driver circuitry 108 and the ambient temperature sensor 120, the microprocessor 200 generates an analog TEC Command signal to set the temperature of the laser emitter in the laser assembly 112. In particular, the microprocessor 200 generates the TEC Command signal based on inputs of $V(I_{laser\ bias})$ from the laser driver circuitry 108, $V_{TL}$ from the laser temperature sensor, $V_{TA}$ from the ambient temperature sensor 120, and calibrated values previously stored within the microprocessor 200 during the calibration of the optoelectronic transceiver 100.

The TEC Command signal is provided to the TEC driver circuitry 116. The TEC driver circuitry 116 is configured to generate an output signal $V_{TEC}$ to drive the TEC 114 in accordance with the TEC Command signal.

FIG. 6 is a logical block diagram illustrating a portion of a circuit implementing the microprocessor 200. The microprocessor 200 includes serial interface circuitry 202 coupled to host device interface input/output lines. In some embodiments, the serial interface circuitry 202 operates in accordance with the two wire serial interface standard that is also used in the GBIC (Gigabit Interface Converter) and SFP (Small Form Factor Pluggable) standards; however, other serial interfaces could equally well be used in alternate embodiments. In yet other embodiments, a multiple-pin interface could be used in place of a serial interface. The interface circuitry 202 is used for setup and querying of the microprocessor 200, and enables access to the optoelectronic transceiver 100 by a host device 220 connected thereto.

The microprocessor 200 may also include one or more volatile and/or nonvolatile memory devices, such as a general purpose EEPROM (electrically erasable and programmable read only memory) device 204, as shown in FIG. 4. Tables and parameters may be set up using the EEPROM device 204 by writing values to predefined memory locations in the memory devices, and various output values may be output by reading from predetermined memory locations in the memory devices. Included in the EEPROM device 204 are one or more lookup tables, which may be used to assign values to control outputs as a function of inputs provided by various sensors.

Also as shown in FIG. 6, the microprocessor 200 includes analog to digital circuitry (A/D) 206 for receiving analog signals from other parts of the optoelectronic transceiver 100 and converting the analog signals to digital values, which may be processed by the digital control logic 208. The control logic 208 is configured to receive digital values from the A/D 206 as well as lookup tables, from the EEPROM 204 and from the host device 220 through the serial interface 202. In addition, the control logic 208 is configured to write selected digital values to predefined memory locations in the EEPROM 204 and output digital values to host devices when polled through the serial interface circuitry 202. Furthermore the control logic 208 is configured to determine the TEC Command signal using the methodology described above. In one embodiment, the control logic 208 is implemented by software instructions executable by the microprocessor 200. In this embodiment, the methodology and/or mathematical formula used to determine the TEC Command signal can be updated and modified without having to replace the microprocessor 200.

Lastly, as illustrated in FIG. 6, digital to analog output circuitry (D/A) 210 is provided to receive digital values from the control logic 208 and convert them into analog signals to regulate other parts of the optoelectronic transceiver 100.

As described in detail above, the wavelength intervals of a channel spacing standard at 100 GHz is 0.8 nm. In order to operate at two channels, therefore, the transceiver 100 must be able to adjust the wavelength output by at least 0.8 nm. Similarly, to operate at three channels, the transceiver 100 must be able to adjust the wavelength output by at least 1.6 nm. The degree to which the wavelength output must be adjusted continues in this fashion for each additional channel. But as indicated above, the channel limit of a 100 GHz channel spacing standard is 45. The channel spacing, and thus the ability of the transceiver 100 to adjust the wavelength output varies proportionally with the channel spacing standard.

In order to control the wavelength output of the transceiver 100, the temperature of laser emitters is adjusted as described in detail below. And as indicated above, the relationship between the temperature of the laser emitter and the wavelength produced is typically around 0.1 nm/° C. This means that if the wavelength output of the transceiver 100 must be adjusted by, for example, is 0.8 nm, the laser emitter temperature must be adjusted by approximately 8° C. Similarly, if the wavelength output of the transceiver 100 must be adjusted by, for example, is 1.6 nm (to support 3 channel selectability), the laser emitter temperature must be adjusted by approximately 16° C.

Figure 7:
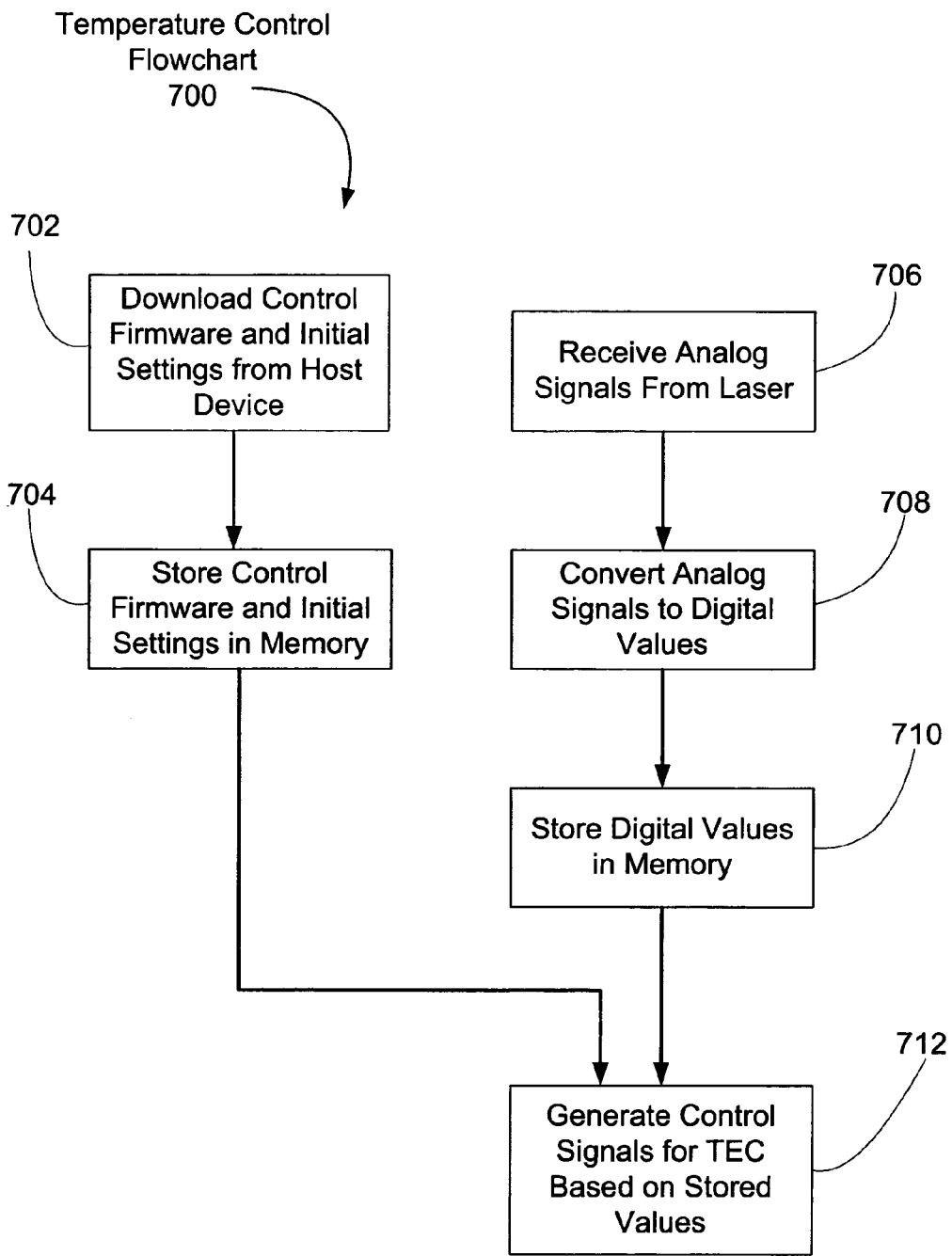
FIG. 7 is a flowchart depicting process steps for controlling the temperature of a laser emitter.

FIG. 7 is a flowchart for controlling the temperature of laser emitters using a microprocessor 200. In step 702 control firmware and initial settings are downloaded from a host device, such as a computer, preferably through serial interface circuitry 202. The control signals include data relating to laser aging and the effect of ambient temperatures on the wavelength of optical signals from a laser emitter, and they may be transmitted to the microprocessor 200 in the optoelectronic transceiver 100 during calibration of the optoelectronic transceiver, as described below. The control commands and signals are stored in the EEPROM 204 (FIG. 6) in step 704. The receipt and storage of control commands and signals in steps 702 and 704 may be accomplished prior to operation of the laser emitter, or while the laser emitter is operating. During operation of the laser emitter, analog signals representing a variety of operating conditions of the laser emitter, including its temperature, the voltage corresponding to the laser bias current, and the ambient temperature surrounding the laser emitter, are generated and received by a microprocessor 200 (FIG. 6) in step 706. The analog signals are converted to digital values in step 708 and stored in the EEPROM 204 of the microprocessor 200 in step 710. Lastly, in step 712 the microprocessor 200 generates control signals for the temperature control mechanism, which preferably includes a TEC 114 and a TEC driver 116, based on the control signals and digital values that have been stored in the EEPROM 204 of the microprocessor 200 during the preceding steps.

Figure 8:
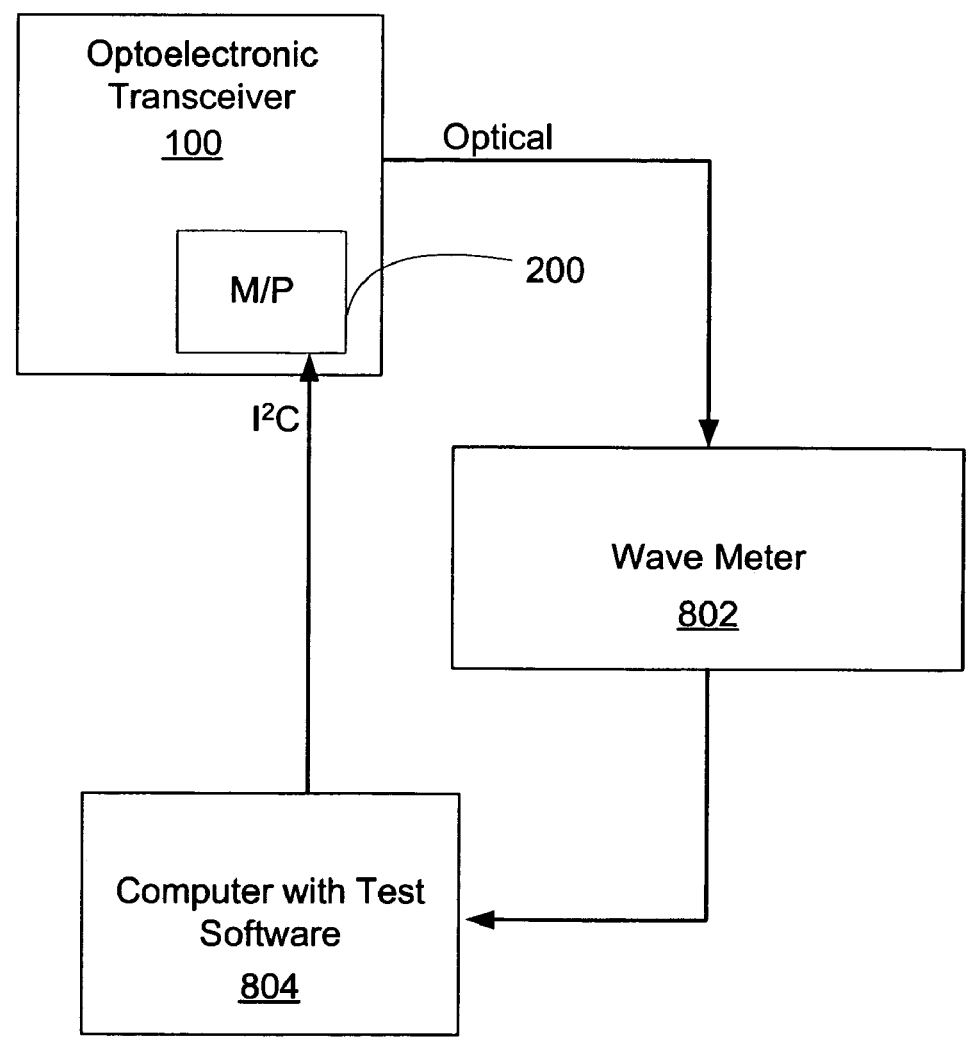
FIG. 8 is a diagram of a setup and tuning system.

FIG. 8 is a logical block diagram illustrating a system for setup and tuning of an optoelectronic assembly. As described above, in applications using Dense Wavelength Division Multiplexing (DWDM), laser emitters must be tuned to transmit optical signals having wavelengths that correspond to ITU channels. The spacing of the ITU channels for DWDM at 100 GHz is 0.8 nm±0.1 nm, at 200 GHz is 1.6 nm±0.2 nm, and at 50 GHz is 0.4 nm±0.05 nm. Laser diodes that are commercially available generally include specification data on the wavelength of optical signals the laser diodes emit while operating at room temperature. However, it is desirable to operate laser diodes used in optoelectronic assemblies above the ambient temperature.

Generally, operating laser diodes above the ambient temperature allows TECs to function more efficiently TECs are more efficient when heating than cooling. TECs are more efficient when heating than cooling because the thermoelectric effect and resistive heating are working together when the TECs are heating the laser diodes, rather than opposing one another as is the case when the TECs are cooling the laser diodes. Efficiency is of particular importance in pluggable transceiver applications, where the available power, and thus the ability of TECs to function, is limited to specified levels. But operating laser diodes at high temperatures may shorten the useful life of the laser diodes.

It is therefore preferable for many applications to tune a laser diode by adjusting the TEC Command signal so that the laser diode emits optical signals that fall within a desired ITU channel wavelength for a selected DWDM frequency when the operating temperature of the laser diode is as high as possible, but not more than 50° C.

With reference to FIG. 8, an optoelectronic transceiver 100 is coupled to transmit optical signals to a wave meter 802. The wave meter 802 measures the wavelength of the optical signals and provides the wavelength to a computer 804 with test software. The computer 804 sends signals to the optoelectronic transceiver 100 through a serial interface using the two wire serial interface standard to adjust the temperature of the laser emitter until the target wavelength for a set of selected ITU channels is reached as described in detail below.

Figure 9:
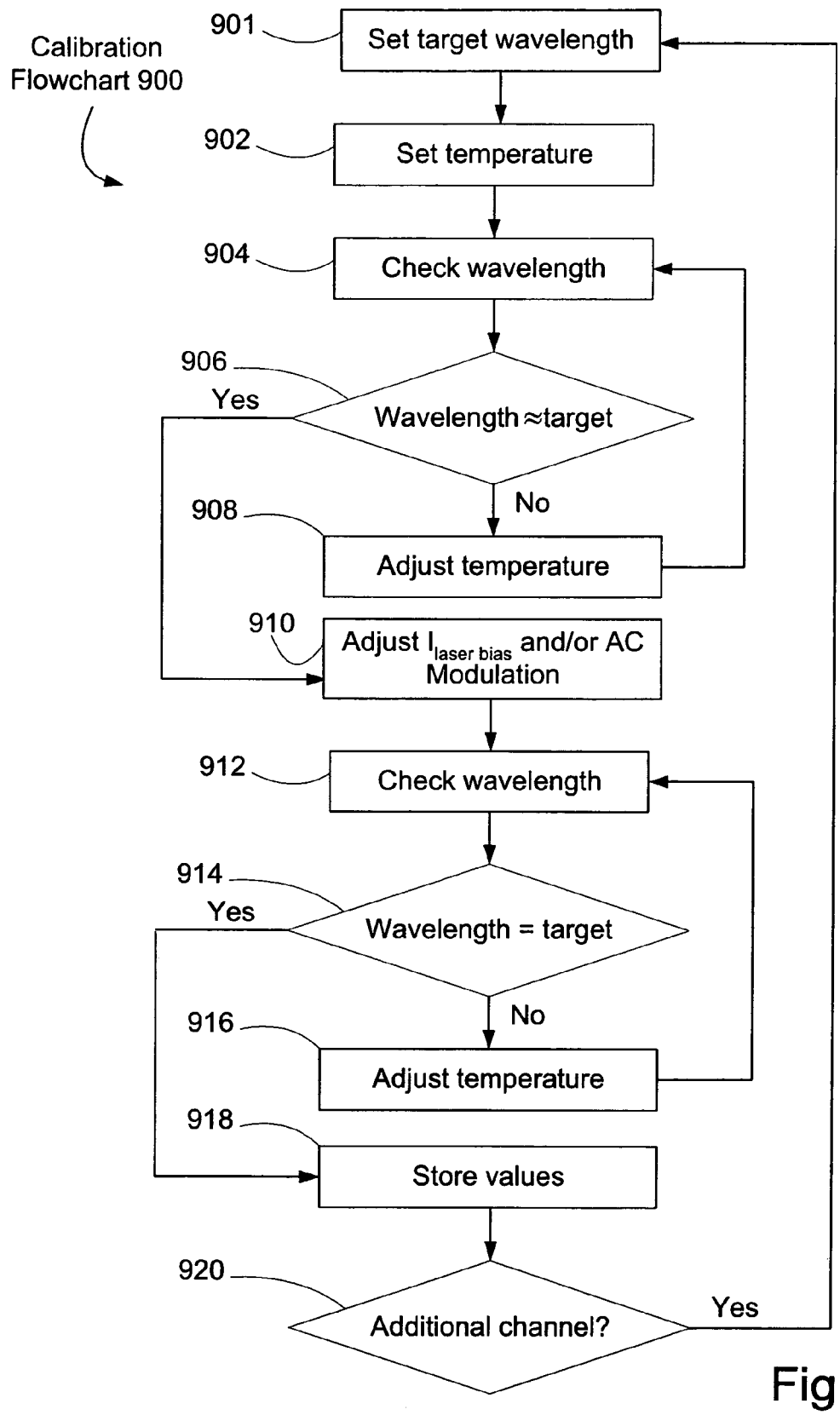
FIG. 9 is a flowchart depicting process steps for calibrating a laser emitter.

FIG. 9 includes a flowchart for calibrating an optoelectronic transceiver 100. In some embodiments, the transceiver 100 is calibrated to operate within two or more ITU channels. In a first step, the computer 804 sets a target wavelength (step 901). The target wavelength lies within an ITU channel, but is not necessarily at the center of the channel. In some embodiments, the target wavelength is lower than the center wavelength to allow for red-shifting that occurs when lasers age.

And as indicated below, the process of calibrating the transceiver 100 to operate within two or more channels typically proceeds from the highest channel to the lowest channel. So when step 901 is executed for the first time, the target wavelength typically corresponds to the highest channel. The calibration process then steps through the channels sequentially as steps 901–918 are executed for each channel.

The computer 804 then commands the microprocessor 200 to set the temperature of the laser emitter in the laser assembly 112 (via the TEC Command signal) (step 902). The first time step 902 is executed, the temperature is preferably set to $T_{setup}$ or 50° C., which is the maximum operating temperature of the laser assembly 112 in some embodiments. During subsequent executions of step 902, however, the temperature is set differently. As described below in connection with step 916, a final temperature for a given channel is selected. When calibrating the next channel, the temperature set in step 902 is preferably this final temperature offset by a predefined amount. For example, if the channel spacing 0.8 nm, this predefined offset may be 7 or 8° C. (i.e., the temperature set in step 902 would be approximately 7 or 8° C. less than the final temperature for the previously calibrated channel).

Additionally, the computer 804 may communicate with the microprocessor 200 through the serial interface 202. The computer 804 may also set $I_{laser\ bias}$ and the AC modulation to default values.

The computer 804 then checks the wavelength of the optical signals via the wave meter 802 (step 904). If the measured wavelength is not approximately equal to the target wavelength (step 906—No), the computer 804 adjusts the temperature of the laser emitter in the laser assembly 112 (step 908). Preferably, the measured wavelength is not approximately equal to the target wavelength until they are within 10 pm of each other. The direction of the adjustment depends upon whether the measured wavelength is greater than or less than the target wavelength. Preferably, the first adjustment is a reduction since the temperature must be less than or equal to $T_{setup}$. Further, the adjustment of the temperature in step 908 represents a coarse adjustment such that it preferably corresponds to a 3–10 pm adjustment of the optical signal's wavelength (depending on the resolution of the D/A 210 and the configuration of the transceiver generally). The goal of steps 904–908 is to get the wavelengths to approximately match, not exactly match so the amount of the reduction in step 908 does not have to be very fine. The computer 904 then repeats steps 904–908 until the measured wavelength is approximately equal to the target wavelength.

Once the measured wavelength is approximately equal to the target wavelength (step 906—Yes), the computer 804 adjusts the DC bias and the AC modulation current to achieve the operational target values for laser power and extinction ratio (step 910). The precise operational target values may vary from one embodiment to the next. In an alternate embodiment, step 910 can be skipped during the calibration of channels other than the first channel, if the channels are sufficiently close that the DC bias and AC modulation levels for the first channel are also suitable for use with those other channels.

The computer 804 then checks the wavelength of the optical signals via the wave meter 802 (step 912). If the measured wavelength is not equal to the target wavelength (step 914—No), the computer 804 adjusts the temperature of the laser emitter in the laser assembly 112 (step 916). Typically, the measured wavelength is "equal" to the target wavelength once it is within 1–5 pm (preferably 5 pm) of the target wavelength. Again, the direction of the adjustment depends upon whether the measured wavelength is greater than or less than the target wavelength. Further, the amount of the temperature reduction in step 916 is preferably smaller than the amount of the reduction in step 908. For example, the adjustment in step 916 may correspond to a 1–3 pm adjustment of the optical signal's wavelength (depending on the resolution of the D/A 210 and the configuration of the transceiver generally).

Figure 10:
FIG. 10 is a diagram of a channel lookup table.

When the measured wavelength is determined to be equal to (or within a predefined margin of) the target wavelength (step 914—Yes), the computer 804 stores values corresponding to (or representing) the temperature of the laser emitter, the DC bias current $I_{laser\ bias}$, and the AC modulation in a channel lookup table 1000 (FIG. 10) maintained by the EEPROM 204 of the microprocessor 200 (step 918). FIG. 10 illustrates an exemplary channel lookup table 1000, which includes a channel designation and corresponding values for the temperature of the laser emitter, the DC bias current $I_{laser\ bias}$, and the AC modulation.

If there is an additional channel for calibration (step 920—Yes), steps 901–918 are executed for the additional channel. If not, the calibration process terminates.

During the operation of the transceiver 100, the microprocessor 200 may receive commands through the serial interface 202 to select one of the channels for which the calibration steps described above have been executed. In still other embodiments, a specific channel is selected just once, in which case the transceiver 100 is then semi-permanently configured to operate at the selected channel. In either case, the microprocessor 200 uses a channel identifier preferably included with the commands to look up corresponding temperature, the DC bias current $I_{laser\_bias}$, and AC modulation values and configures the transceiver 100 accordingly.

In some embodiments, a transceiver controller (not illustrated) is used to perform some of the functions otherwise performed by the microprocessor 200. For example, a transceiver controller may be used to look up values in tables and outputting these values through one or more digital to analog converters. Accordingly, the lookup table 100 (or portions of the lookup table 100) may also be accessible to or stored by the transceiver controller so that it may output some control signals while the microprocessor 200 outputs other control signals.

The foregoing descriptions of specific embodiments are presented for purposes of illustration and description. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. Accordingly, it is the claims, not merely the foregoing illustration, that are intended to define the exclusive rights of the invention.

What is claimed is:

1. A method of calibrating a multichannel optoelectronic assembly, comprising:
    selecting first and second target wavelengths, separated from each other by a predefined channel separation amount;
    setting a temperature of the optoelectronic assembly to a first value;
    operating the optoelectronic assembly to emit light;
    adjusting the temperature until a difference between an output wavelength of the optoelectronic assembly and the first target wavelength is less than a predefined value, and durably storing a first value corresponding to the adjusted temperature control as a first control value associated with the first target wavelength; and
    adjusting the temperature until a difference between an output wavelength of the optoelectronic assembly and the second target wavelength is less than the predefined value, and durably storing a second value corresponding to the adjusted temperature as a second control value associated with the second target wavelength.

2. The method of claim 1, including monitoring a laser temperature from within the optoelectronic assembly and an ambient temperature from within a housing in which the optoelectronic assembly resides, and adjusting the temperature of the optoelectronic assembly as a function of both the monitored laser temperature and the monitored ambient temperature.

3. The method of claim 1, wherein the first value and the second value both correspond to temperatures within the range of 30° C. and 50° C.

4. A method of calibrating a multichannel optoelectronic assembly, comprising:
    selecting as a target wavelength a wavelength from a set of wavelengths including two or more wavelengths;
    setting a temperature of the optoelectronic assembly to a first value;
    adjusting the temperature with increments greater than an adjustment amount until a difference between an output wavelength of the optoelectronic assembly and the target wavelength is less than a first predefined value;
    setting one or more operating values of the optoelectronic assembly, said one or more operating values affecting the temperature;
    adjusting the temperature with increments less than the adjustment amount until the difference between the output wavelength of the optoelectronic assembly and the target wavelength is less than a second predefined value, said second predefined value less than the first predefined value;
    storing a value corresponding to the temperature and the one or more operating values once the difference between the output wavelength of the optoelectronic assembly and the target wavelength is less than the second predefined value; and
    repeating said selecting step, each of said setting steps, each of said adjusting steps, and said storing step for each additional wavelength in the set of wavelengths.

5. The method of claim 4, including monitoring a laser temperature from within the optoelectronic assembly and an ambient temperature from within a housing in which the optoelectronic assembly resides, and adjusting the temperature of the optoelectronic assembly as a function of both the monitored laser temperature and the monitored ambient temperature.

6. The method of claim 4, wherein the value corresponding to the temperature stored for each selected wavelength is within the range of 30° C. and 50° C.

* * * * *